(12) United States Patent
Frougier et al.

(10) Patent No.: US 11,805,704 B2
(45) Date of Patent: Oct. 31, 2023

(54) VIA INTERCONNECTS FOR A MAGNETORESISTIVE RANDOM-ACCESS MEMORY DEVICE

(71) Applicant: International Business Machines Corporation, Armonk, NY (US)

(72) Inventors: Julien Frougier, Albany, NY (US); Dimitri Houssameddine, White Plains, NY (US); Ruilong Xie, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 532 days.

(21) Appl. No.: 16/869,754

(22) Filed: May 8, 2020

(65) Prior Publication Data

US 2021/0351340 A1    Nov. 11, 2021

(51) Int. Cl.
| | | |
|---|---|---|
| *H10N 50/80* | (2023.01) | |
| *H10B 61/00* | (2023.01) | |
| *H10N 50/01* | (2023.01) | |
| *H10N 50/10* | (2023.01) | |
| *H10N 50/85* | (2023.01) | |

(52) U.S. Cl.
CPC ............. *H10N 50/80* (2023.02); *H10B 61/00* (2023.02); *H10N 50/01* (2023.02); *H10N 50/10* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 6,713,802 B1 * | 3/2004 | Lee | H10N 50/01 257/E27.005 |
| 6,849,465 B2 | 2/2005 | Park et al. | |
| 9,024,399 B2 | 5/2015 | Guo | |
| 9,087,633 B2 | 7/2015 | Khvalkovskiy et al. | |
| 9,373,782 B2 | 6/2016 | Li et al. | |
| 9,865,806 B2 | 1/2018 | Choi et al. | |
| 10,002,903 B2 | 6/2018 | Lim et al. | |
| 10,580,973 B2 | 3/2020 | Doyle et al. | |
| 2004/0219298 A1 * | 11/2004 | Fukunaga | H01L 21/02074 257/E21.174 |
| 2006/0040487 A1 * | 2/2006 | Inoue | C23C 18/32 257/E21.174 |

(Continued)

FOREIGN PATENT DOCUMENTS

| | | | |
|---|---|---|---|
| EP | 2277211 B1 * | 10/2014 | ............ G11C 11/161 |
| EP | 4020606 A2 * | 6/2022 | ............ H01L 27/228 |

(Continued)

*Primary Examiner* — Michael Lebentritt
(74) *Attorney, Agent, or Firm* — Jeffrey M. Ingalls

(57) ABSTRACT

A via interconnect structure for an MRAM device is provided. The via interconnect structure includes an interlayer dielectric layer having a via formed therein, a magnetic metal layer formed in the via, the magnetic metal layer having a cavity formed therein, and a nonmagnetic metal layer formed in the cavity of the magnetic metal layer. The magnetic metal layer is configured such that magnetization vectors of the magnetic metal layer are least substantially in-plane relative to an MRAM stack structure of the MRAM device.

13 Claims, 10 Drawing Sheets

(56) References Cited

U.S. PATENT DOCUMENTS

| | | | | |
|---|---|---|---|---|
| 2011/0233696 A1* | 9/2011 | Li | ............ | H10N 50/01 |
| | | | | 257/E29.323 |
| 2012/0326250 A1* | 12/2012 | Gaidis | ............ | H10N 50/01 |
| | | | | 257/E29.323 |
| 2013/0029431 A1* | 1/2013 | Takahashi | ............ | H10N 50/01 |
| | | | | 438/3 |
| 2016/0027998 A1 | 1/2016 | Mudivarthi et al. | | |
| 2016/0093670 A1* | 3/2016 | Jiang | ............ | H10N 50/01 |
| | | | | 257/421 |
| 2016/0099408 A1 | 4/2016 | Nagamine et al. | | |
| 2019/0109281 A1 | 4/2019 | Doyle et al. | | |
| 2019/0206935 A1* | 7/2019 | Kim | ............ | G11C 11/1675 |
| 2021/0091300 A1* | 3/2021 | Doris | ............ | H10N 50/10 |

FOREIGN PATENT DOCUMENTS

| | | | | | |
|---|---|---|---|---|---|
| JP | 2011519165 A | * | 6/2011 | | |
| WO | WO-2016007126 A1 | * | 1/2016 | ............ | G11C 11/161 |
| WO | WO-2019005164 A1 | * | 1/2019 | | |

* cited by examiner

VIA INTERCONNECTS FOR A MAGNETORESISTIVE RANDOM-ACCESS MEMORY DEVICE

BACKGROUND

The present disclosure relates to the electrical, electronic and computer fields. In particular, the present disclosure relates to magnetoresistive random-access memory ("MRAM") device cells including via interconnect structures as a bottom electrode of the MRAM device.

Certain MRAM devices include a bottom electrode comprising a bilayer structure including a magnetic metal layer and a nonmagnetic metal layer. A first portion of the bilayer structure may be a bottom connection corresponding to an underlaying metal level formed in the middle-of-line (MOL) or back-end-of-line (BEOL) in which the embedded MRAM is integrated. This metal level may comprise a magnetic metal forming the connection due the lower resistivity of the material. A second portion of the bilayer structure may be a bottom electrode formed under the embedded MRAM device, and it may comprise a non-magnetic metal material. It may be desirable to limit any magnetic interference between the magnetic metal layer and the MRAM stack.

SUMMARY

Embodiments of the present disclosure relate to a via interconnect structure for an MRAM device is provided. The via interconnect structure includes an interlayer dielectric layer having a via formed therein, a magnetic metal layer formed in the via, the magnetic metal layer having a cavity formed therein, and a nonmagnetic metal layer formed in the cavity of the magnetic metal layer. The magnetic metal layer is configured such that magnetization vectors of the magnetic metal layer are least substantially in-plane relative to an MRAM stack structure of the MRAM device.

Other embodiments of the present disclosure relate to an MRAM device. The MRAM device includes a via interconnect structure including an interlayer dielectric layer having a via formed therein, a magnetic metal layer formed in the via, the magnetic metal layer having a cavity formed therein, and a nonmagnetic metal layer formed in the cavity of the magnetic metal layer. The MRAM device also includes an MRAM stack structure formed on the via interconnect structure. The magnetic metal layer is configured such that magnetization vectors of the magnetic metal layer are least substantially in-plane relative to the MRAM stack structure.

Other embodiments relate to a method of manufacturing an MRAM device. The method includes forming a via interconnect structure by forming an interlayer dielectric layer. Forming the via interconnect structure including forming a via in the interlayer dielectric layer, forming a magnetic metal layer in the via, the magnetic metal layer having a cavity formed therein, and forming a nonmagnetic metal layer in the cavity of the magnetic metal layer. The method also includes forming an MRAM stack structure on the via interconnect structure. The magnetic metal layer is configured such that magnetization vectors of the magnetic metal layer are least substantially in-plane relative to the MRAM stack structure.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

Figure 1A:
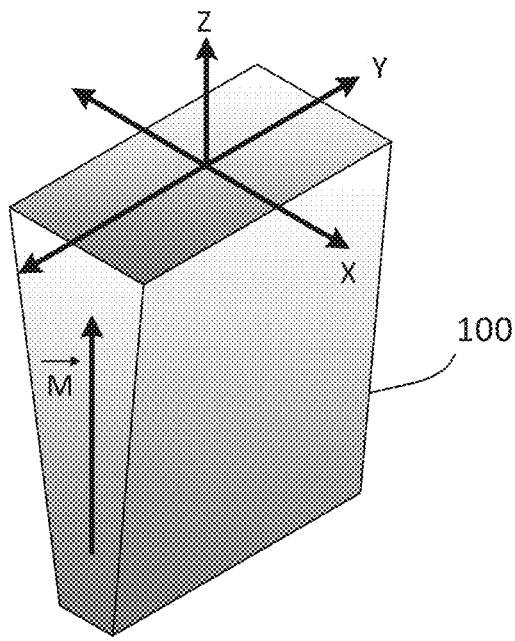
FIG. 1A is a perspective view of the basic structure of an example via interconnect for and MRAM device.

It should be appreciated that elements in the figures are illustrated for simplicity and clarity. Well-understood elements that may be useful or necessary in a commercially feasible embodiment may not be shown for the sake of simplicity and to aid in the understanding of the illustrated embodiments.

DETAILED DESCRIPTION

The present disclosure describes MRAM devices including magnetic tunnel junction ("MTJ") stacks and methods of manufacturing MRAM devices. In particular, the present disclosure describes MRAM devices which include a magnetically engineered via interconnect structure. In the present embodiments, the via interconnect structure is a two layer structure which may function as a bottom electrode of an MRAM device. A first layer of the via interconnect may be a magnetic metal layer in contact with the sidewalls of the via. This magnetic metal layer may or may not be in direct contact with the stack structure of the MRAM device, according to the different embodiments described herein.

In certain embodiments, the magnetization vectors generated by the magnetic material of the magnetic metal layer are oriented in-plane due to the particular shape anisotropy of the magnetic metal layer. The second layer of the via interconnect may be a nonmagnetic metal layer that is at least partially embedded in the magnetic metal layer. This nonmagnetic metal layer is in contact with magnetic metal layer, and it is in contact with the stack structure of the MRAM device. Because the magnetization vectors generated by the via interconnect structure are in-plane or at least substantially in-plane, they are less likely to interfere with the magnetic design of the MRAM device and impact its performance.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, embedded DRAM (eDRAM) is a dynamic random-access memory (DRAM) integrated on the same die or multi-chip module (MCM) of an application-specific integrated circuit (ASIC) or microprocessor. eDRAM has been implemented in silicon-on-insulator (SOI) technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory (MRAM) devices using magnetic tunnel junctions (MTJ) are one option to replace existing eDRAM technologies. MRAM is a non-volatile memory, which is a type of computer memory that can retrieve stored information even after power has been cycled. This benefit of being able to store information even when power is cycled is a driving factor that is accelerating the development of this memory technology.

A magnetic tunnel junction (MTJ) device, which is a primary storage element in a magnetic random access memory (MRAM), is a magnetic storage and switching device in which two ferromagnetic layers are separated by a thin insulating barrier (e.g., aluminum oxide) to form a stacked structure. One of the ferromagnetic layers has a magnetization that is fixed, and it is therefore referred to as a fixed layer or pinned layer or reference layer. However, the other ferromagnetic layer has a magnetization that can change, and it is therefore referred to as a free layer. When a bias is applied to the MTJ device, electrons that are spin polarized by the ferromagnetic layers traverse the insulating barrier through a process known as quantum tunneling to generate an electric current whose magnitude depends on an orientation of magnetization of the ferromagnetic layers. The MTJ device will exhibit a low resistance when a magnetic moment of the free layer is parallel to the fixed layer magnetic moment, and it will exhibit a high resistance when the magnetic moment of the free layer is oriented anti-parallel to the fixed layer magnetic moment.

The materials and geometries used to build the stack of different layers forming the MTJ device are factors that affect the characteristics of the device in terms of speed (i.e., switching time) and power consumption (e.g., voltage and/or current required to switch the device from one state to another). As discussed briefly above, certain MTJ devices have a pillared structure (i.e., a stack of materials) having a cylindrical shape, where current flows from a top layer to a bottom layer, or vice versa, in order to switch the magnetization of one ferromagnetic layer. These types of MTJ devices are generally referred to as spin transfer torque (STT) MTJ devices. Certain STT MRAM devices may have limited switching speed and endurance in comparison to static random access memory (SRAM) devices (i.e., random access memory that retains data bits in its memory as long as power is being supplied). Other types of MTJ devices are referred to as spin orbit torque (SOT) devices. In the SOT type of device, the stacked pillar structure is still cylindrically shaped, but the stack is deposited on top of a heavy metal conductor. In the SOT type of MTJ device, current flows horizontally in this conductor and switches the magnetization of the ferromagnetic layer at the interface.

In STT type MRAM devices, the manufacture of the devices is often performed in conjunction with forming middle-of-line (MOL) or back-end-of-line (BEOL) layers. This may be referred to as embedded MRAM, where the MRAM devices are embedded in, or formed in conjunction with these layers. In general, front-end-of-line (FEOL) refers to the set of process steps that form transistors and other circuit elements (such as resistors and capacitors) that are later connected electrically with middle-of-line (MOL) and back-end-of-line (BEOL) layers. In general, MOL refers to the set of wafer processing steps used to create the structures that provide the local electrical connections between transistors (e.g., gate contact formation). MOL processing generally occurs after FEOL processes and before BEOL processes. In general, the BEOL is the portion of IC fabrication where the individual devices (transistors, capacitors, resistors, etc.) are interconnected with wiring on the wafer. It is generally desirable to minimize the total thickness of the MRAM device so that when it is embedded into the MOL (or BEOL) the overall thickness of that layer can be minimized as well. As discussed in further detail below, the structure of the via interconnects of the present embodiments enables a reduction in the total height of the MRAM device, which in turn enables a possible reduction in the total height of the MOL (or BEOL) layer as well.

In certain embedded MRAM devices, the via interconnect structure (which can also be considered to be a bottom electrode of the MRAM device) includes two layers stacked on top of each other (i.e., a bilayer structure), which is a relatively tall structure. A first portion of the bilayer structure may be a bottom connection corresponding to an underlying metal level formed in the middle-of-line (MOL) or back-end-of-line (BEOL) in which the embedded MRAM is integrated. This metal level may comprise a magnetic metal (e.g., cobalt) forming the connection due the lower resistivity of the material. A second portion of the bilayer structure may be a bottom electrode formed under the embedded MRAM device, and it may comprise a non-magnetic metal material (e.g., tungsten). This relatively tall structure may not be ideal for co-integration with LOGIC devices depending on the MOL and BEOL vertical inter-level space.

Moreover, due to the particular geometry of the first metal layer (i.e., which is the magnetic metal portion of the via interconnect structure), a stray magnetic field may develop that can interfere with the performance of the MRAM stack structure. In particular, Co is a magnetic metal. Given typical via dimensions, the shape anisotropy will fix the via magnetization out-of-plane (i.e., perpendicular to the surface of the wafer). The fringing magnetic field generated by the Co metal layer can interact with the magnetic structural components of the MRAM device and introduce magnetic imbalances. However, as described in further detail below, the via interconnect structure of the present embodiments allow the fringing magnetic field lines of the cobalt metal layer to be dominantly confined in-plane by fixing the magnetization vector orientation in-plane by leveraging the dominant shape anisotropy. Therefore, according to the present embodiments, there may be no interaction (or very little interaction) with the magnetic components of the overall MRAM structure. This may help to limit performance degradation of the MRAM device.

Figure 1B:
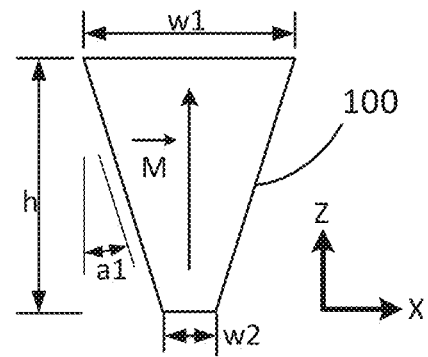
FIG. 1B is a cross-sectional side view of the via interconnect of FIG. 1A in the X direction.
Figure 1C:
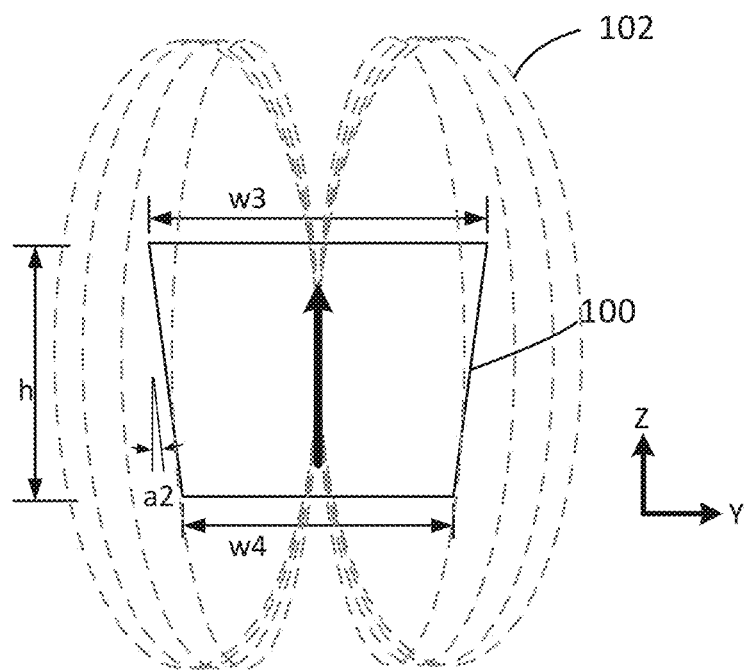
FIG. 1C is a cross-sectional side view of the via interconnect of FIG. 1A in the Y direction.

Referring now to the drawings in which like numerals represent the same or similar elements and initially to FIGS. 1A-1C, an example of a magnetic metal layer 100 of a via interconnect structure is shown. In this example, the magnetic metal layer 100 has a generally tapered or wedge-shaped profile. As shown in the perspective view of FIG. 1A, the magnetic metal layer 100 has an asymmetrical shape anisotropy that causes a magnetization of the via structure to be out-of-plane (i.e., perpendicular to the X-Y plane of the wafer). In the cross-sectional view of FIG. 1B (which is along line X of FIG. 1A), a width w1 of a top side of the magnetic metal layer 100 is greater than a width w2 of a bottom side of the magnetic metal layer 100. Also, the sidewalls of the magnetic metal layer 100, as shown in FIG. 1B, are tapered at an angle a1. In certain examples, the height h of the magnetic metal layer 100 may be greater than the width w1. In the cross-sectional view of FIG. 1C (which is along the Y line of FIG. 1A) the width w3 and the width w4 may be respectively greater than the width w1 shown in FIG. 1B.

Also, as shown in FIG. 1C, the width w3 is somewhat greater than the width w4 on the bottom side of the magnetic metal layer 100. Also, the sidewalls of the magnetic metal layer 100, as shown in FIG. 1C are tapered at an angle a2. The angles a1 and a2 may be the same or different, and they may be any suitable angles. As also shown in FIG. 1C, the stray magnetic field lines 102 are shown to extend out-of-plane with respect to the X-Y plane shown in FIG. 1A. As mentioned above, these stray magnetic field lines 102 can interfere with the MRAM device (not shown) that is formed above the via interconnect structure. It should be appreciated that the particular heights, widths, and tapered angles are merely examples of one geometry of a magnetic metal layer 100 of a via structure, and other heights, widths, and angles of the magnetic metal layer 100 may be implemented. It should also be appreciated that the example anisotropic shape of the magnetic metal layer 100 in FIGS. 1A-1C is merely to illustrate how the magnetic field lines may be oriented relative to an MRAM device structure, and thus interfere with the MRAM device performance.

Figure 2A:
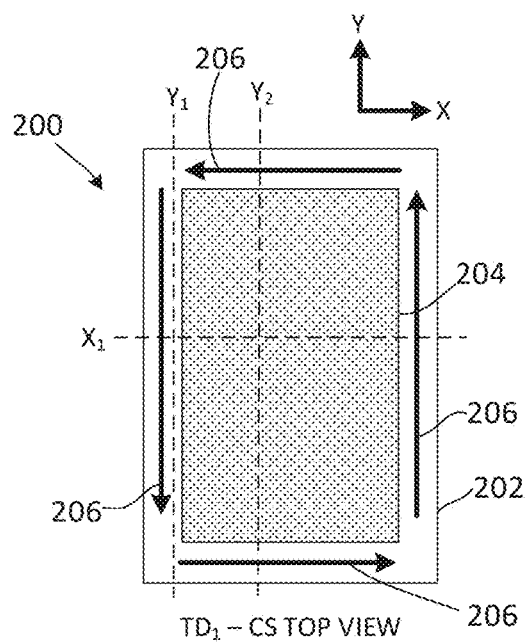
FIG. 2A is a cross-sectional top-down view of a via interconnect, taken along the $TD_1$ line of FIG. 2B, according to embodiments.

Referring now to FIGS. 2A-2D, an example of a via interconnect structure 200 having an embedded two layer design is shown, according to embodiments. FIG. 2A is a cross-sectional top-down view of the via interconnect structure 200, taken along the line $TD_1$ in FIG. 2B. In certain embodiments, the via interconnect structure 200 includes a magnetic metal layer 202, and a nonmagnetic metal layer 204 embedded within a hollowed out portion of the magnetic metal layer 202.

Figure 2B:
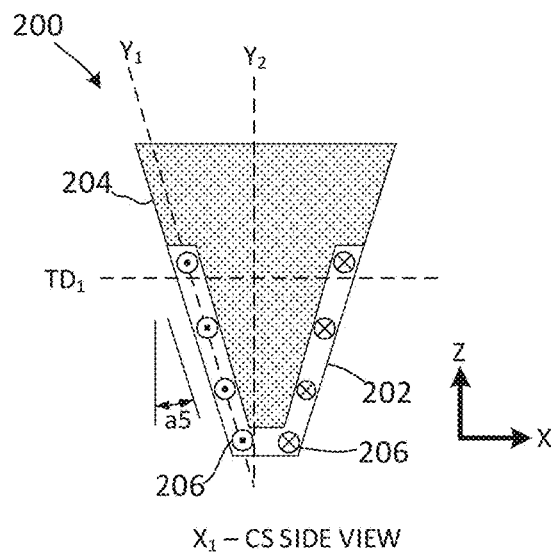
FIG. 2B is a cross-sectional side view of the via interconnect of FIG. 2A, taken along the $X_1$ line of FIG. 2A, according to embodiments.

FIG. 2B is a cross-sectional view of the via interconnect structure 200, taken along the line $X_1$ from FIG. 2A. As shown in FIG. 2B, the magnetic metal layer 202 is first formed. This magnetic metal layer 202 is formed in such a way as to allow for the nonmagnetic metal layer 204 to be later formed within a cavity of the magnetic metal layer 202. In the example shown in FIG. 2B, sidewalls of the via interconnect structure 200 have a tapered angle a5.

Figure 2C:
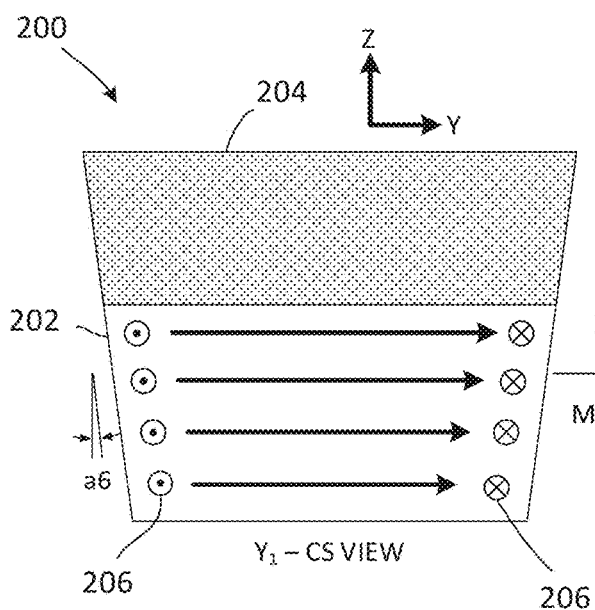
FIG. 2C is a side view of the via interconnect of FIG. 2A, from the perspective of the $Y_1$ lines of FIGS. 2A and 2B, according to embodiments.
Figure 2D:
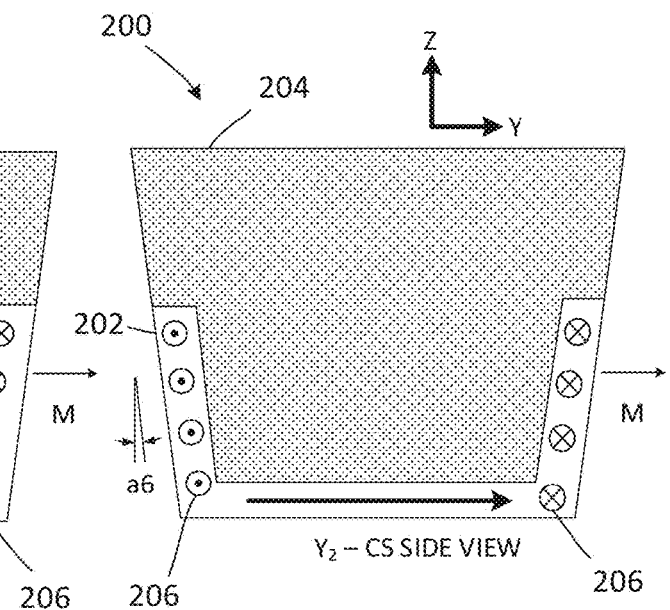
FIG. 2D is a cross-sectional side view of the via interconnect of FIG. 2A, from the perspective of the $Y_2$ lines of FIGS. 2A and 2B, according to embodiments.

FIG. 2C is a side view of the via interconnect structure 200, taken along the line $Y_1$ shown in FIG. 2A. In the example shown in FIG. 2C, sidewalls of the via interconnect structure 200 have a tapered angle a6. It should be appreciated that any suitable angles may be used for the sidewalls of the via interconnect structure 200 (even vertical sidewalls), and they may be the same as or different from each other. As shown in the side view of FIG. 2C, the magnetic metal layer 202 extends only partially up a combined height of the via interconnect structure 200. Moreover, the magnetic field lines 206 are substantially in-plane in contrast to the out-of-plane stray magnetic field lines 102 described above with respect to FIG. 1C. Also, because a portion of the nonmagnetic metal layer 204 is formed within a cavity (or hollowed out portion) in the magnetic metal layer 202 (see also, FIG. 2D), the combined height of the via interconnect structure 200 can be reduced (in comparison to an example via interconnect structure where the nonmagnetic metal layer is stacked directly on top of the magnetic metal layer). This reduced combined height of the via interconnect structure 200 may be helpful co-integrating the embedded MRAM device with standard LOGIC without having to increase the MOL or BEOL vertical inter-level space.

As shown in FIGS. 2A-2D, the magnetization vectors 206 wrap around the nonmagnetic metal layer 204 in an in-plane direction. In other words, the magnetic energy in the magnetic material is now minimized by having the magnetization oriented in-plane due to the change in shape anisotropy. In the present embodiments, a circle with a dot in the middle represents a magnetization vector 206 coming out of the plane of the drawing, and a circle with an X in the middle represents a magnetization vector 206 going into the plane of the drawing. Thus, there will be no interaction, or little interaction of the stray magnetic field lines with the MRAM magnetic structures. It should be appreciated that any suitable geometry (e.g., the relative heights and widths of top and bottom surfaces thereof, as well as any taper angles) of the magnetic metal layer 202 may be used, provided that the dominant shape anisotropy yields stray magnetic field lines (i.e., magnetization vectors 206) that are confined to be in-plane, or at least substantially in-plane.

Figure 3A:
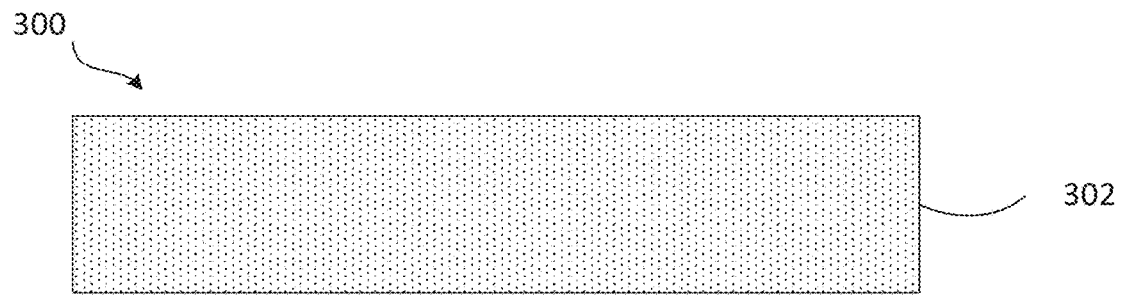
FIG. 3A is a cross-sectional view depicting an MRAM device including a via interconnect, at an intermediate stage of the manufacturing process, according to embodiments.

Referring now to FIGS. 3A-3K and initially to FIG. 3A, a cross-sectional view depicting an MRAM device 300 at an intermediate stage of the manufacturing process is shown, according to embodiments. In FIG. 3A, a base layer 302 is provided. The base layer 302 may include certain electrical interconnections, wiring lines, or other devices. For example, the base layer 302 may include front-end-of-line (FEOL) elements (e.g., transistors, circuit elements, resistors, capacitors, etc.) or middle-of-line (MOL) elements (e.g., electrical connections between transistors, gate contact formation structures, etc.). It should be appreciated that the base layer 302 may include any suitable number of different components and may include a plurality of sub-layers with different components. In general, the base layer 302 is any suitable layer that can function as a starting structure upon which the embedded MRAM device can be formed.

Figure 3B:
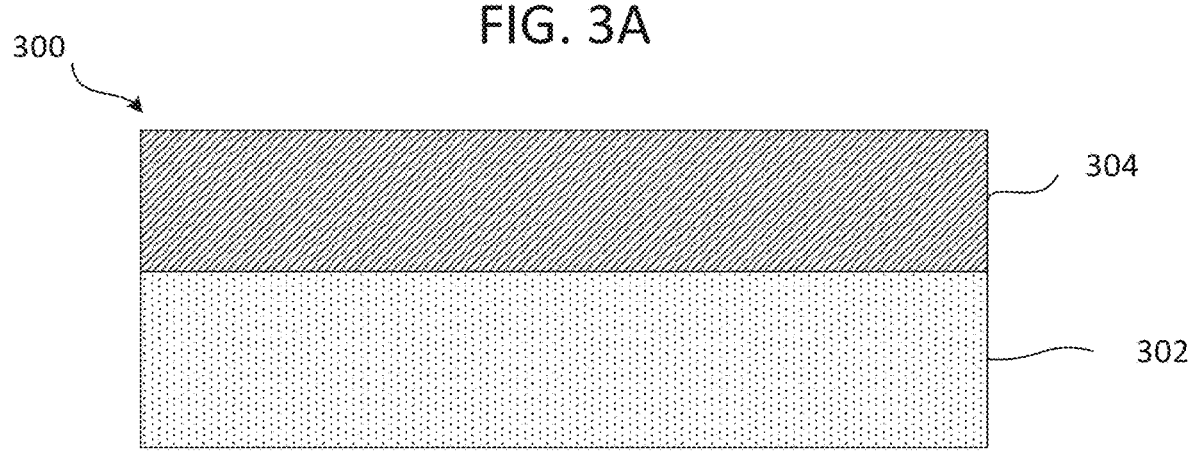
FIG. 3B is a cross-sectional view of the MRAM device of FIG. 3A after additional fabrication operations, according to embodiments.

Referring now to FIG. 3B, an interlayer dielectric layer 304 is formed on the base layer 302. The interlayer dielectric layer 304 may be composed of, for example, SiCOH, $SiO_x$, $SiN_x$, SiBCN, low-κ, NBLOK, or any other suitable dielectric material.

Figure 3C:
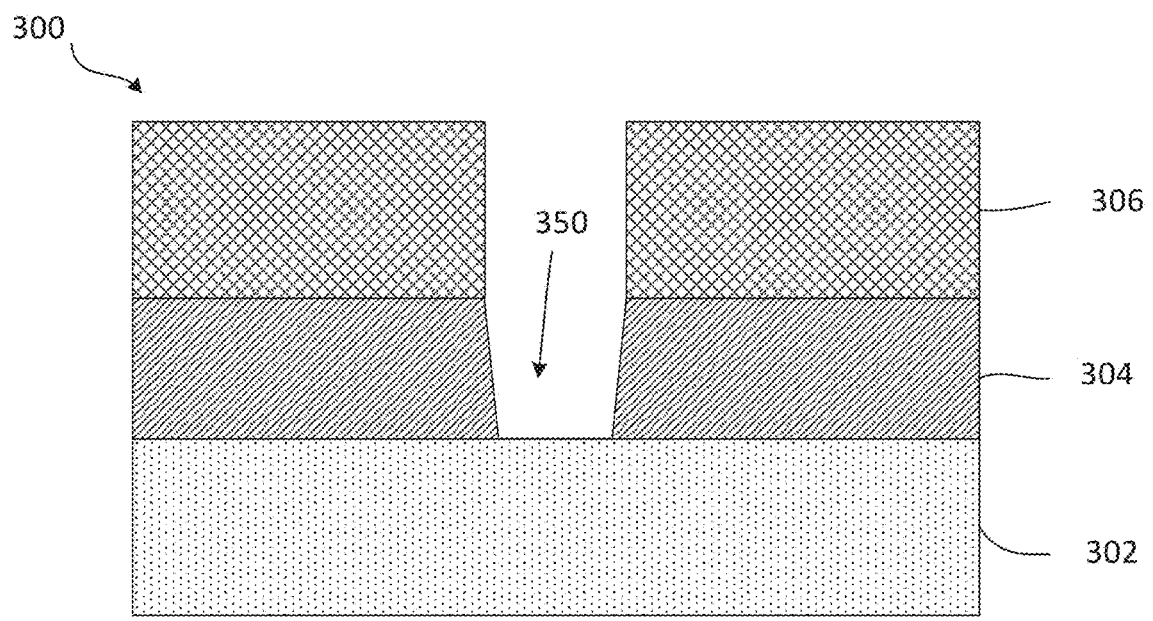
FIG. 3C is a cross-sectional view of the MRAM device of FIG. 3B after additional fabrication operations, according to embodiments.

Referring now to FIG. 3C, an organic planarization layer 306 (OPL) is formed on the interlayer dielectric layer 304. It should be appreciated that any suitable OPL material or combination of materials may be used. After the formation of the organic planarization layer 306, the organic planarization layer 306 is patterned to form an opening. This opening will allow for the subsequent formation of the via 350 in the interlayer dielectric layer 304. The via 350 may be formed by any suitable material removal process known to one of skill in the art, as described herein. For example, reactive ion etching (RIE) may be used to remove the material of the interlayer dielectric layer 304. As shown in FIG. 3C, the sidewalls of the organic planarization layer 306 may have a certain amount of taper due to the nature of the removal process. It should be appreciated that any taper angle in the via 350 of the interlayer dielectric layer 304 may be the same as, or different from, any other taper angles shown in the embodiments described herein. Alternatively, the via 350 may have vertical, or nearly vertical sidewall.

Figure 3D:
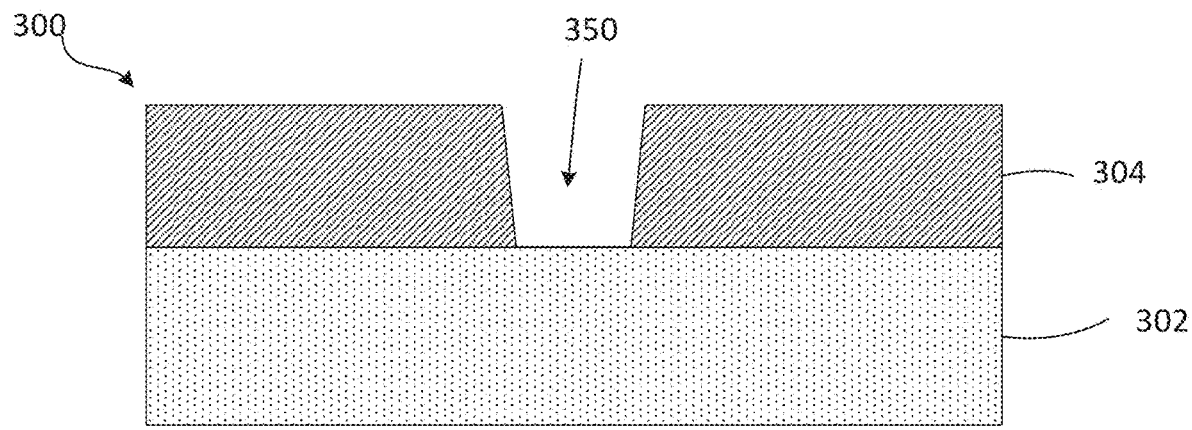
FIG. 3D is a cross-sectional view of the MRAM device of FIG. 3C after additional fabrication operations, according to embodiments.

Referring now to FIG. 3D, an ashing process is performed to remove the organic planarization layer 306. At this stage in the manufacturing process, only the base layer 302 and the interlayer dielectric layer 304 remain, where the interlayer dielectric layer 304 includes the via 350 formed therein. It should be appreciated that any other removal process other than ashing may be performed in order to remove the organic planarization layer 306.

Figure 3E:
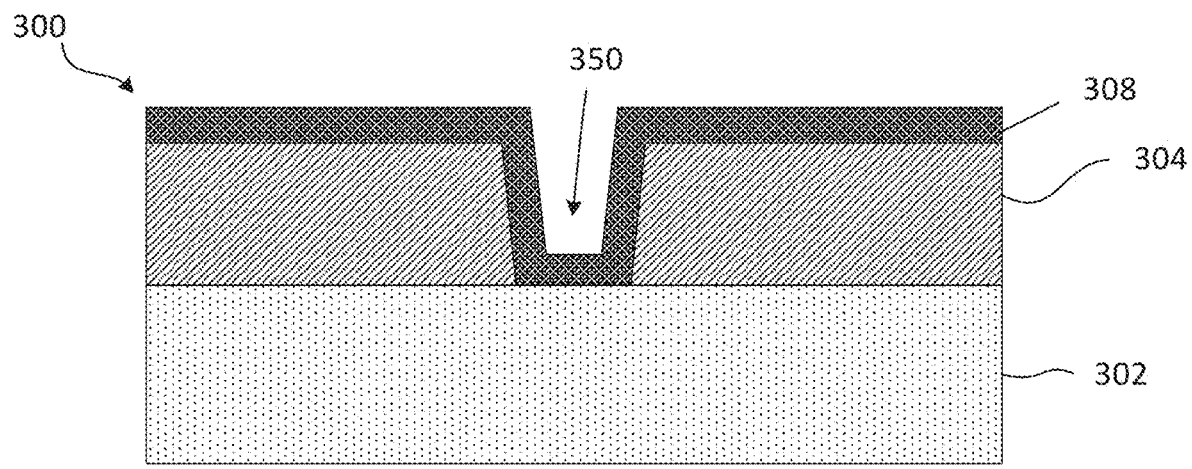
FIG. 3E is a cross-sectional view of the MRAM device of FIG. 3D after additional fabrication operations, according to embodiments.

Referring now to FIG. 3E, a magnetic metal layer 308 is conformally deposited over the entire surface of the wafer. In certain embodiments, a low resistance metal such as cobalt may be used for the magnetic metal layer 308. The relatively low resistance of cobalt may lead to a reduction in the MRAM series resistance, which may to prevent bit cell TMR degradation (i.e., the read margin). In certain embodiments, the magnetic metal layer 308 does not fill the entire volume of the via 350. Thus, there is a cavity or hollowed-out portion in the magnetic metal layer 308. As described in further detail below, at least a portion of this cavity of the magnetic metal layer 308 is filled in with the nonmagnetic metal layer 312 (see, FIG. 3H).

Figure 3F:
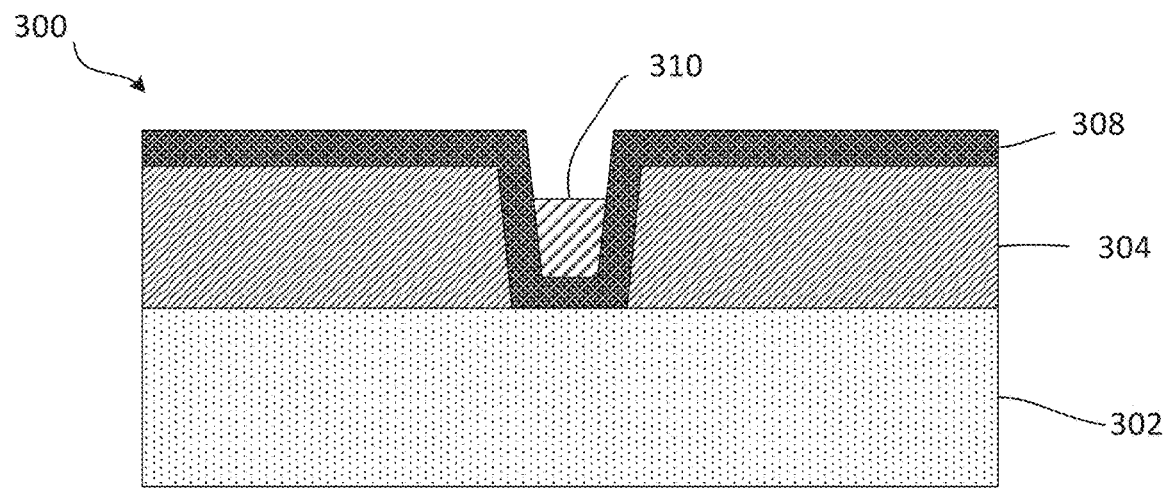
FIG. 3F is a cross-sectional view of the MRAM device of FIG. 3E after additional fabrication operations, according to embodiments.

Referring now to FIG. 3F, a second organic planarization layer 310 is formed. Initially, the second organic planarization layer 310 can be formed to fill the entire remaining space in the via 350 and may also extend upwardly from the magnetic metal layer 308. In a second step, material of the second organic planarization layer 310 is removed to form a recess in the area previously corresponding to the via 350. In other words, an upper surface of the resulting second organic planarization layer 310 is lower than, or recessed below, an upper surface of both the magnetic metal layer 308 and the interlayer dielectric layer 304. The upper surface of the second organic planarization layer 310 will define a stopping point for the subsequent removal of the magnetic metal layer 308, as described below with respect to FIG. 3G.

Figure 3G:
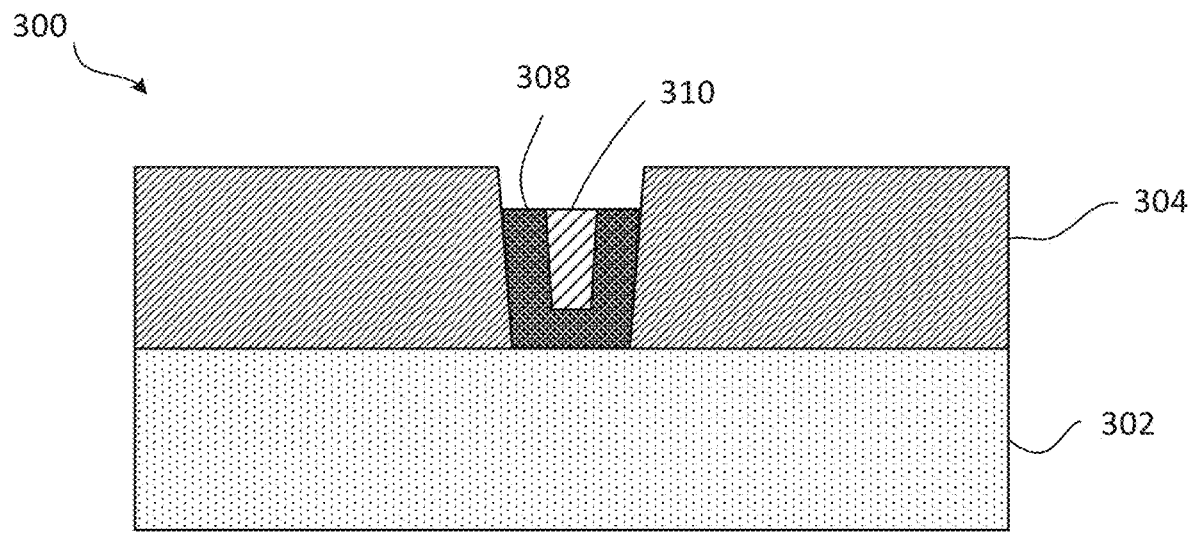
FIG. 3G is a cross-sectional view of the MRAM device of FIG. 3F after additional fabrication operations, according to embodiments.

Referring now to FIG. 3G, a chamfering process is performed to remove portions of the magnetic metal layer 308. As shown in FIG. 3G, the upper surface of the resulting magnetic metal layer 308 is coplanar with, or at least substantially coplanar with the upper surface of the second organic planarization layer 310. It should be appreciated that any suitable material removal process may be utilized to remove these portions of the magnetic metal layer 308. Thus, at this stage in the manufacturing process, the upper surface of the remaining magnetic metal layer 308 is below an upper surface of the interlayer dielectric layer 304. As will be described in further detail below, this position of the upper surface of the magnetic metal layer 308 will allow for a certain portion of nonmagnetic metal material to be interposed between the magnetic metal layer 308 and the MRAM stack structure formed above. In other words, in these embodiments, the magnetic metal layer 308 will not directly contact the MRAM stack structure.

Figure 3H:
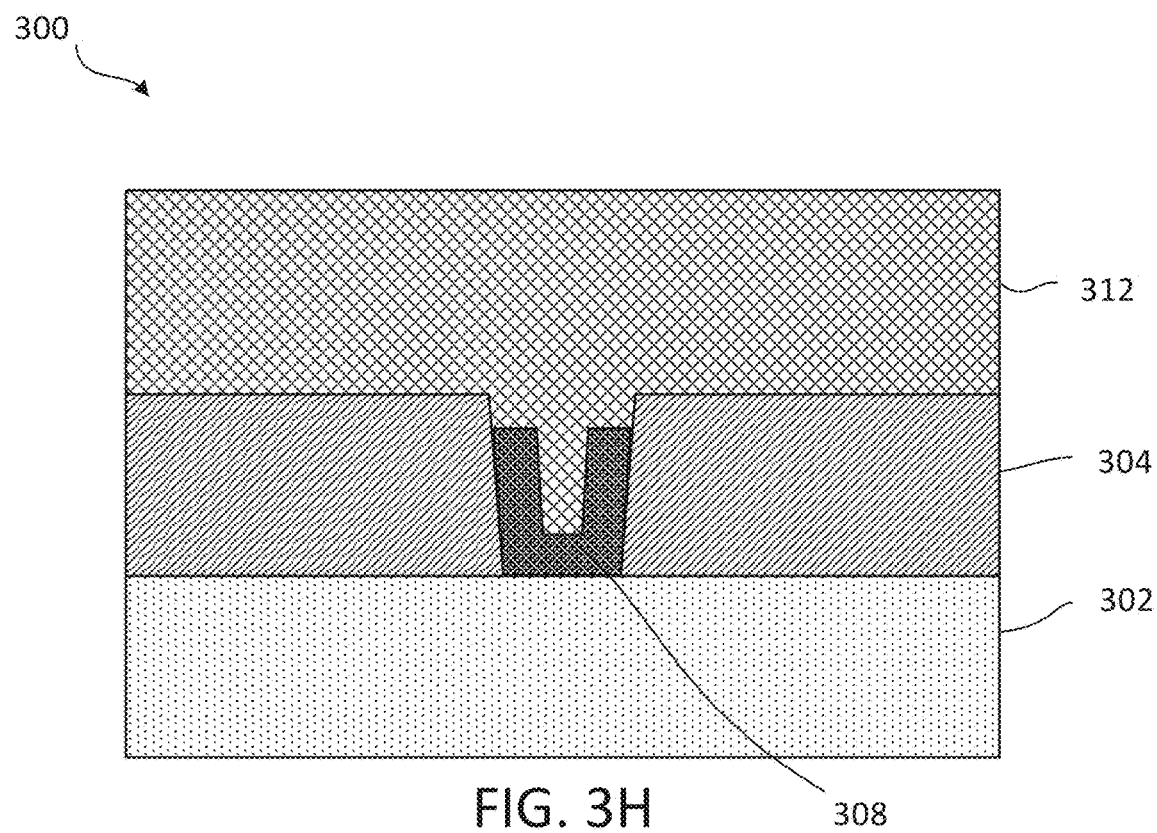
FIG. 3H is a cross-sectional view of the MRAM device of FIG. 3G after additional fabrication operations, according to embodiments.

Referring now to FIG. 3H, an ashing process is used to remove all remaining portions of the second organic planarization layer 310 (not shown). After the material of the second organic planarization layer 310 is removed, a nonmagnetic metal layer 312 is then formed. The nonmagnetic metal layer 312 is formed to fill in any remaining spaces of the via 350 (e.g., the cavity or hollowed-out portion of the magnetic metal layer 308) and is overfilled to extend a certain distance above the upper surface of the interlayer dielectric layer 304. In certain embodiments, the material of the nonmagnetic metal layer 312 is tungsten (W). However, it should be appreciated that any other nonmagnetic metal material or combination of materials may be utilized to form the nonmagnetic metal layer 312. One characteristic of using a material such as tungsten to form the nonmagnetic metal layer 312 is that tungsten (or TaN) is highly compatible with chemical mechanical planarization (CMP) to meet planarization levels required for MRAM efficient and reliable MRAM integration.

Figure 3I:
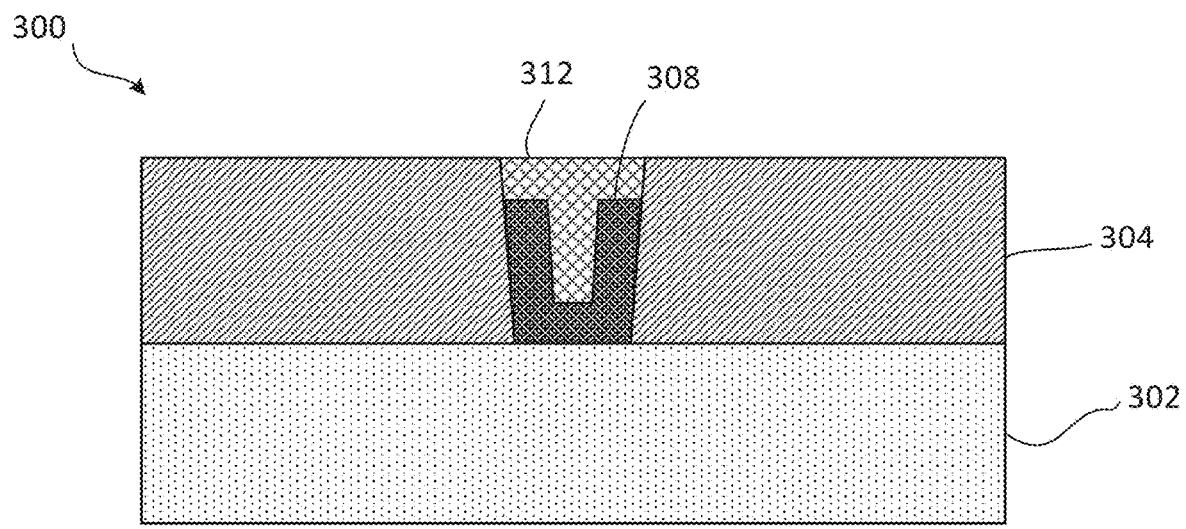
FIG. 3I is a cross-sectional view of the MRAM device of FIG. 3H after additional fabrication operations, according to embodiments.

Referring now to FIG. 3I, metal CMP is performed on the wafer to remove portions of the nonmagnetic metal layer 312 above the surface of the interlayer dielectric layer 304. As indicated above, planarization of, for example, tungsten or TaN is well understood for MRAM integration. In certain embodiments, this planarization step is important in preventing defect propagation in the subsequently formed MRAM stack. Therefore, high quality planarization of the nonmagnetic metal layer 312 helps with respect to device endurance and reliability degradation. At this stage, the entire via interconnect structure has been formed, and includes the magnetic metal layer 308 and the nonmagnetic metal layer 312. This combined via interconnect structure 200 was described in detail above with respect to FIGS. 2A-2D. It should be appreciated that the dimensions and angles shown in FIGS. 2A-2D may be different than those shown in FIG. 3I. However, any differences are merely for ease of illustration, and are not to be interpreted as limiting.

In certain embodiments, the combined via interconnect structure (magnetic metal layer 308 and nonmagnetic metal layer 312) represents a bottom electrode of the MRAM device that is embedded in the via 350. The magnetic metal layer 308 is in contact with the sidewalls of the via 350 and is not in direct contact with the subsequently formed MRAM device. Also, the nonmagnetic metal layer 312 is embedded in the magnetic metal layer 308, and it is in direct contact with the subsequently formed MRAM device. In certain examples, the final combined via interconnect structure is a bottom electrode where the magnetic metal layer 308 has a horseshoe shape in both directions perpendicular to each other. In certain embodiments, the height of the magnetic metal layer 308 is less than both the length and the width of a bottom surface of the magnetic metal layer 308 (i.e., which corresponds to the bottom of the previously formed via 350). Due to the shape anisotropy of the resulting magnetic metal layer 308, the bottom electrode of the MRAM device has magnetization vectors that are oriented in-plane. It should be appreciated that the thickness of the magnetic metal layer 308, the height of the magnetic metal layer 308, the thickness of the nonmagnetic metal layer 312, or any other suitable dimensions thereof may be varied accordingly provided that the resulting magnetization vectors of the magnetic metal layer 308 are oriented in-plane.

Figure 3J:
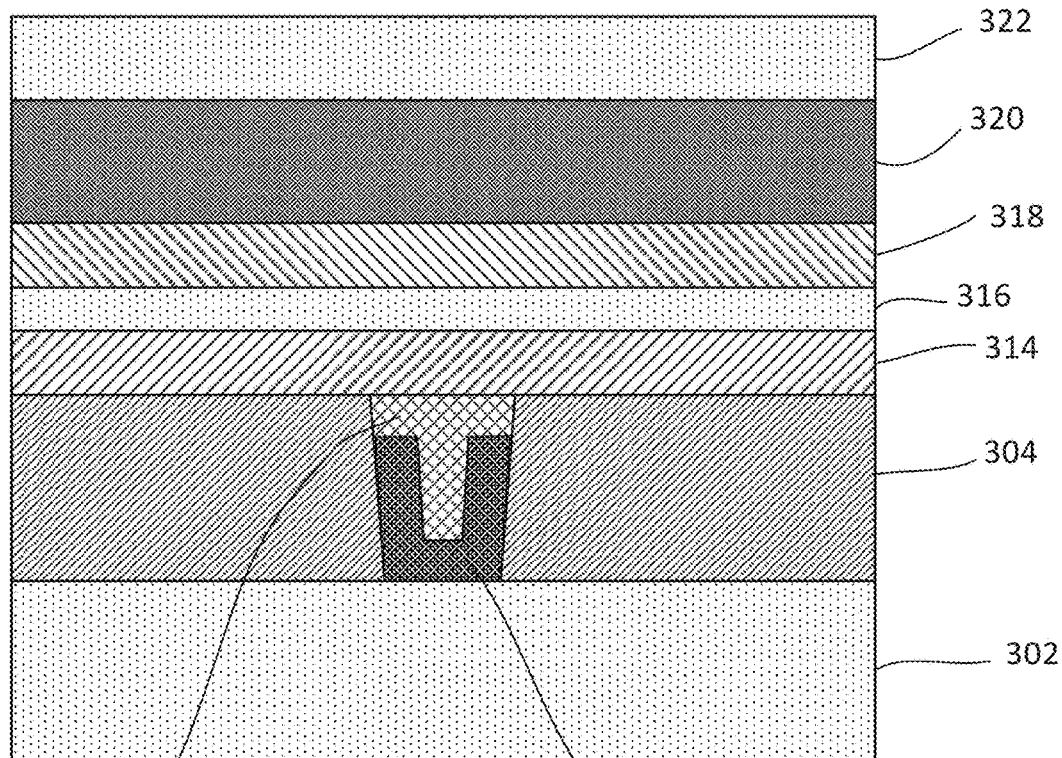
FIG. 3J is a cross-sectional view of the MRAM device of FIG. 3I after additional fabrication operations, according to embodiments.

Referring now to FIG. 3J, an MRAM stack is formed on the upper surfaces of the interlayer dielectric layer 304 and the nonmagnetic metal layer 312. In certain embodiments, the MRAM stack includes a reference layer 314, a tunnel barrier layer 316, a magnetic free layer 318 and a top electrode 320. The tunnel barrier layer 316 is formed on the reference layer 314. Following the formation of the tunnel barrier layer 316, the magnetic free layer 318 is formed on the tunnel barrier layer 316. Next, the top electrode 320 is formed on the magnetic free layer 318. Finally, a hard mask layer 322 is formed on the top electrode 320. It should be appreciated that this MRAM stack structure is only an example, and any other suitable MRAM stack structure known to one of skill in the art may be utilized. It should also be appreciated that this example MRAM stack structure may include one or more additional layers, include intervening layers, and any of the layers described with respect to the MRAM stack structure may contain a plurality of sublayers.

Figure 3K:
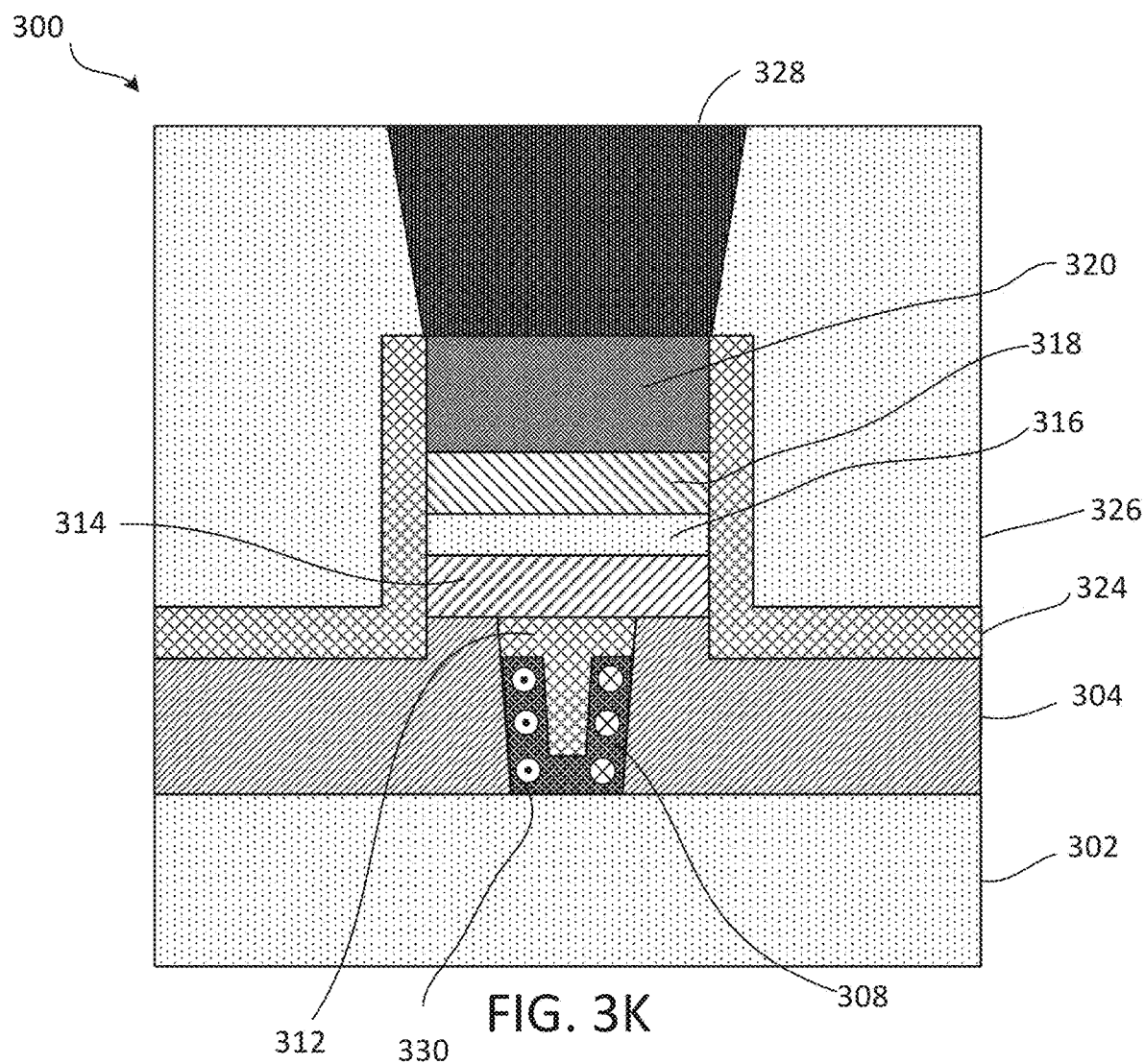
FIG. 3K is a cross-sectional view of the MRAM device of FIG. 3J after additional fabrication operations, according to embodiments.

Referring now to FIG. 3K, patterning is performed on the MRAM stack structure to form the MRAM device pillar. In certain embodiments, a dielectric liner layer 324 is formed to encapsulate the MRAM device pillar. The dielectric liner layer 324 may be comprised of SiN or any other suitable dielectric materials. As shown in FIG. 3K, the dielectric liner layer 324 covers the sidewall surfaces of the reference layer 314, the tunnel barrier layer 316, the magnetic free layer 318 and the top electrode 320. The dielectric liner layer 324 also covers top surfaces of the interlayer dielectric layer 304. Although not shown in FIG. 3K, the dielectric liner layer 324 may initially be formed to conformally cover the entire surface of the wafer, followed by formation of a portion of a second interlayer dielectric layer 326, followed by the removal of upper portions of the dielectric liner layer 324 and second interlayer dielectric layer 326 by a CMP process to expose the upper surface of the top electrode 320. Following the formation of the dielectric liner layer 324, additional material of the second interlayer dielectric layer 326 is added to increase the overall thickness of the second interlayer dielectric layer 326. Although not shown in FIG. 3K, portions of the second interlayer dielectric layer 326 are removed to create an interlayer dielectric layer via (not shown), and this interlayer dielectric layer via may accommodate subsequent formation of a top contact via 328.

Figure 4A:
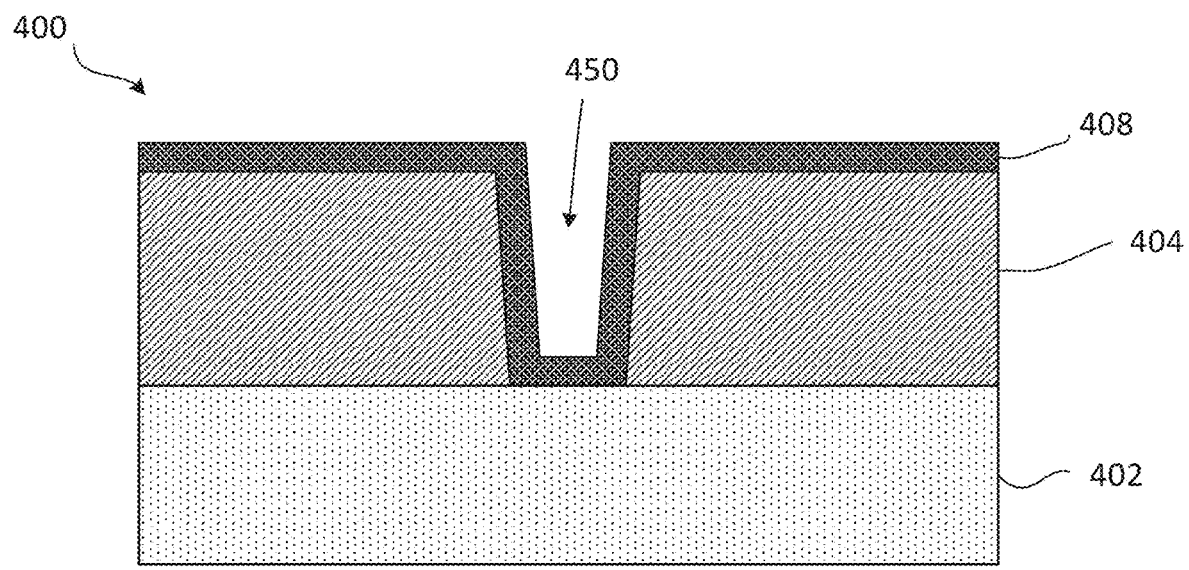
FIG. 4A is a cross-sectional view depicting an MRAM device including a via interconnect, at a stage of the manufacturing process corresponding to the MRAM device shown in FIG. 3E, according to embodiments.

Referring now to FIGS. 4A-4E and initially to FIG. 4A, a cross-sectional view depicting an MRAM device 400 at an intermediate stage of the manufacturing process is shown, according to other embodiments. FIG. 4A shows the MRAM device 400 at a stage of the manufacturing process that is equivalent to the MRAM device 300 shown in FIG. 3E. Accordingly, the description of the manufacturing processes described above with respect to FIGS. 3A-3E will not be repeated here. As shown in FIG. 4A, a base layer 402 is provided, and an interlayer dielectric layer 404 is formed on the base layer 402. A magnetic metal layer 408 is conformally deposited over the entire surface of the wafer, and a via 450 is formed therein. It should be appreciated that the number and the order of processing steps required to produce the MRAM device structure shown in FIG. 4A may be the same as, or different from, the number and the order of processing steps described above with respect to FIGS. 3A-3E.

Figure 4B:
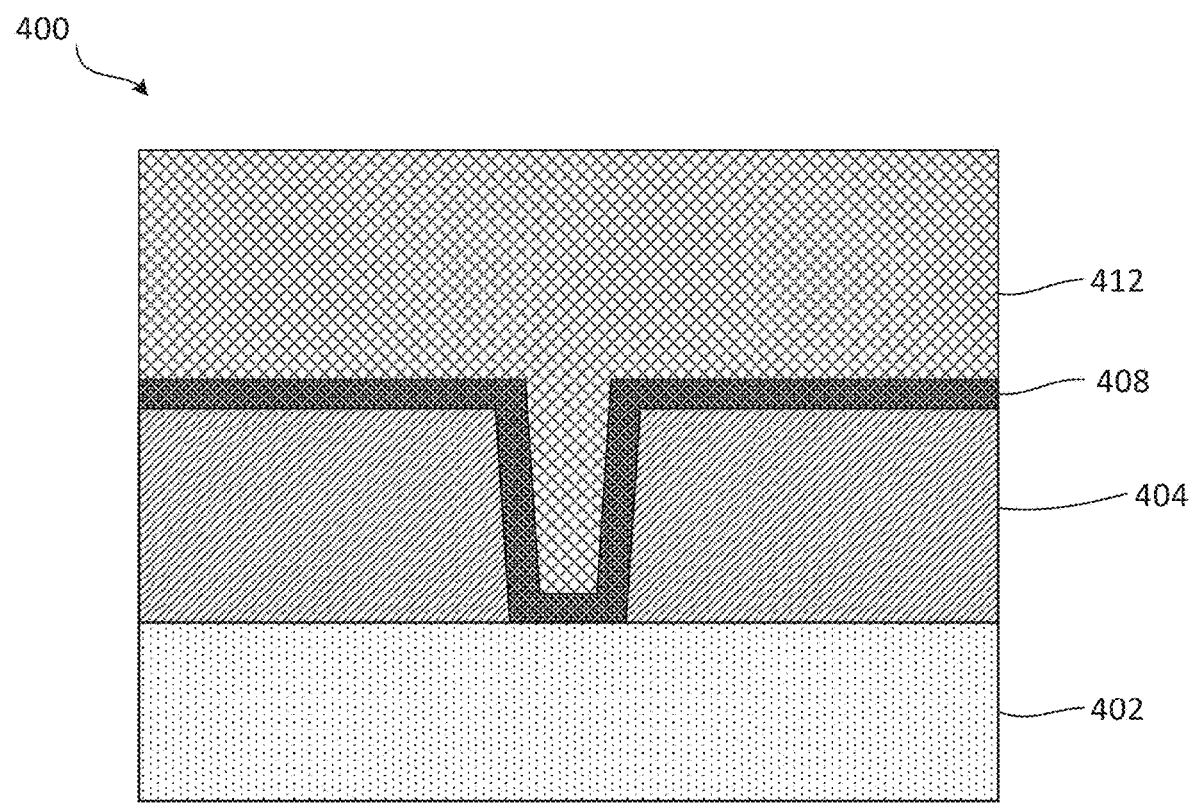
FIG. 4B is a cross-sectional view of the MRAM device of FIG. 4A after additional fabrication operations, according to embodiments.

Referring now to FIG. 4B, a nonmagnetic metal layer 412 is formed to fill in the via 450 and is overfilled to extend a certain distance above the upper surface of the interlayer dielectric layer 404. In certain embodiments, the material of the nonmagnetic metal layer 412 is tungsten (W) or TaN. However, it should be appreciated that any other nonmagnetic metal material or combination of materials may be utilized to form the nonmagnetic metal layer 412. Therefore, unlike the nonmagnetic metal layer 312 described above with respect to the embodiments of FIGS. 3A-3K, the nonmagnetic metal layer 412 extends to a top surface of the interlayer dielectric layer 404. As will be described in further detail below, this difference enables direct contact between a portion of the nonmagnetic metal layer 412 and the subsequently formed MRAM stack structure.

Figure 4C:
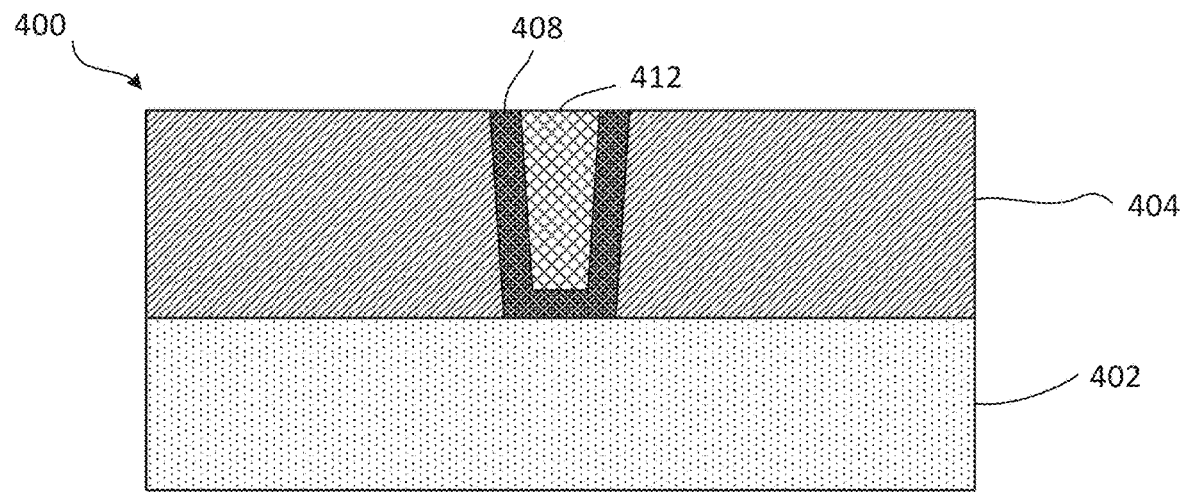
FIG. 4C is a cross-sectional view of the MRAM device of FIG. 4B after additional fabrication operations, according to embodiments.

Referring now to FIG. 4C, metal CMP is performed on the wafer to remove portions of the nonmagnetic metal layer 412 and the interlayer dielectric layer 404. After the metal CMP process has been performed, upper surfaces of the magnetic metal layer 408 are coplanar with upper surfaces of the nonmagnetic metal layer 412 and upper surfaces of the remaining interlayer dielectric layer 404. At this stage, the entire via interconnect structure has been formed, and includes the magnetic metal layer 408 and the nonmagnetic metal layer 412. In certain embodiments, the combined via interconnect structure (magnetic metal layer 408 and nonmagnetic metal layer 412) represents a bottom electrode of the MRAM device that is embedded in the previously formed via 450. In these embodiments, only the magnetic metal layer 408 is in contact with the sidewalls of the via 450. However, in contrast with the embodiments described above, portions of the magnetic metal layer 408 will be in direct contact with the subsequently formed MRAM device. Also, the nonmagnetic metal layer 412 is embedded in the magnetic metal layer 408 and will be in direct contact with the subsequently formed MRAM device.

In certain examples, the final combined via interconnect structure is a bottom electrode where the magnetic metal layer 408 has a horseshoe shape in both directions perpendicular to each other. In certain embodiments, the height of the magnetic metal layer 408 is less than both the length and the width of a bottom surface of the magnetic metal layer 408 (i.e., which corresponds to the bottom of the previously formed via 450). Due to the shape anisotropy of the resulting magnetic metal layer 408, the bottom electrode of the MRAM device has magnetization vectors that are oriented in-plane. It should be appreciated that the thickness of the magnetic metal layer 408, the height of the magnetic metal layer 408, the thickness of the nonmagnetic metal layer 412, or any other suitable dimensions thereof may be varied accordingly provided that the resulting magnetization vectors of the magnetic metal layer 408 are oriented in-plane.

Figure 4D:
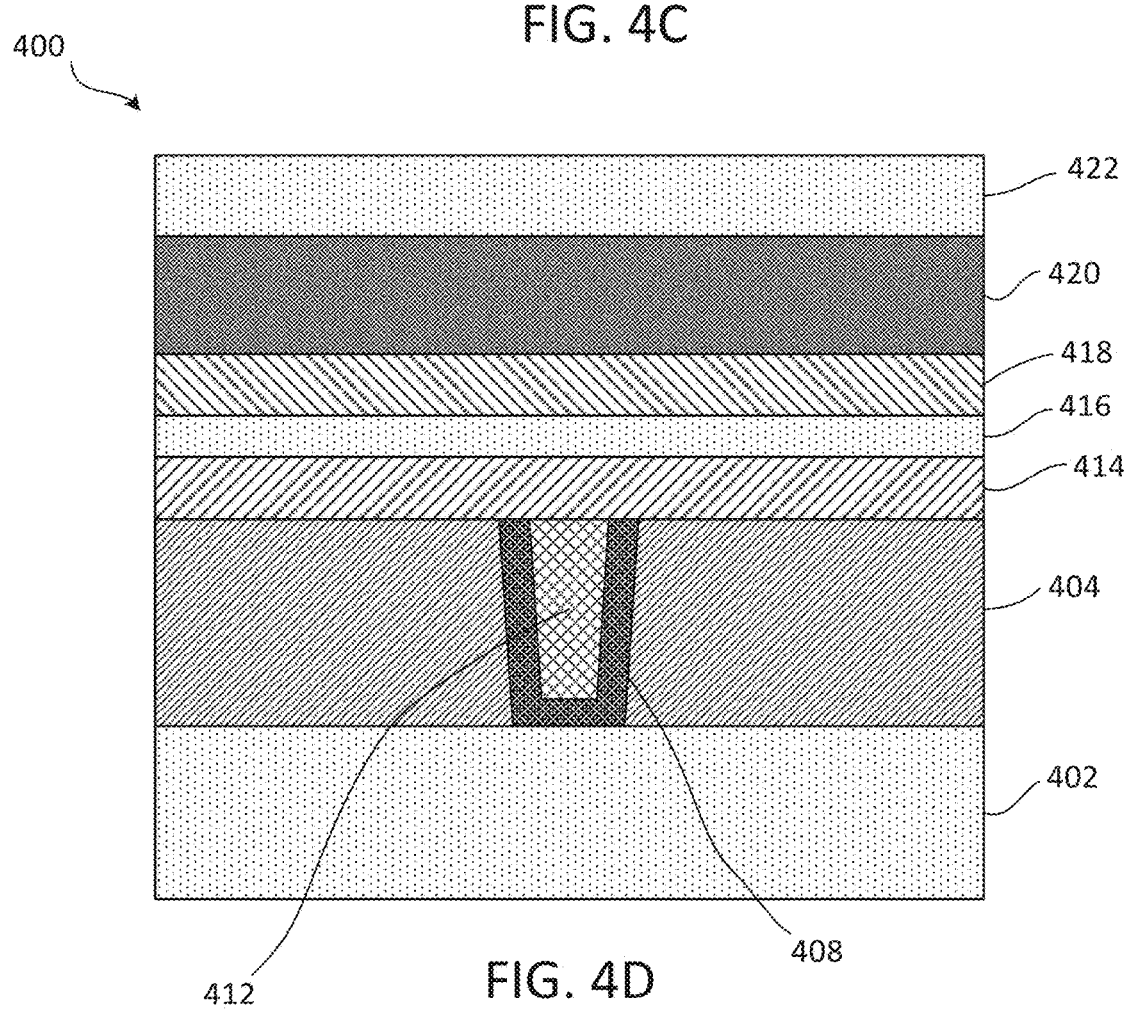
FIG. 4D is a cross-sectional view of the MRAM device of FIG. 4C after additional fabrication operations, according to embodiments.

Referring now to FIG. 4D, an MRAM stack is formed on the upper surfaces of the interlayer dielectric layer 404, the magnetic metal layer 408, and the nonmagnetic metal layer 412. In certain embodiments, the MRAM stack includes a reference layer 414. Then, a tunnel barrier layer 416 is formed on the reference layer 414. Following the formation of the tunnel barrier layer 416, a magnetic free layer 418 is formed on the tunnel barrier layer 416. Next, a top electrode 420 is formed on the magnetic free layer 418. Finally, a hard mask layer 422 is formed on the top electrode 420. It should be appreciated that this MRAM stack structure is only an example, and any other suitable MRAM stack structure known to one of skill in the art may be utilized. It should also be appreciated that this example MRAM stack structure may include one or more additional layers, intervening layers, and any of the layers described with respect to the MRAM stack structure may contain a plurality of sublayers.

Figure 4E:
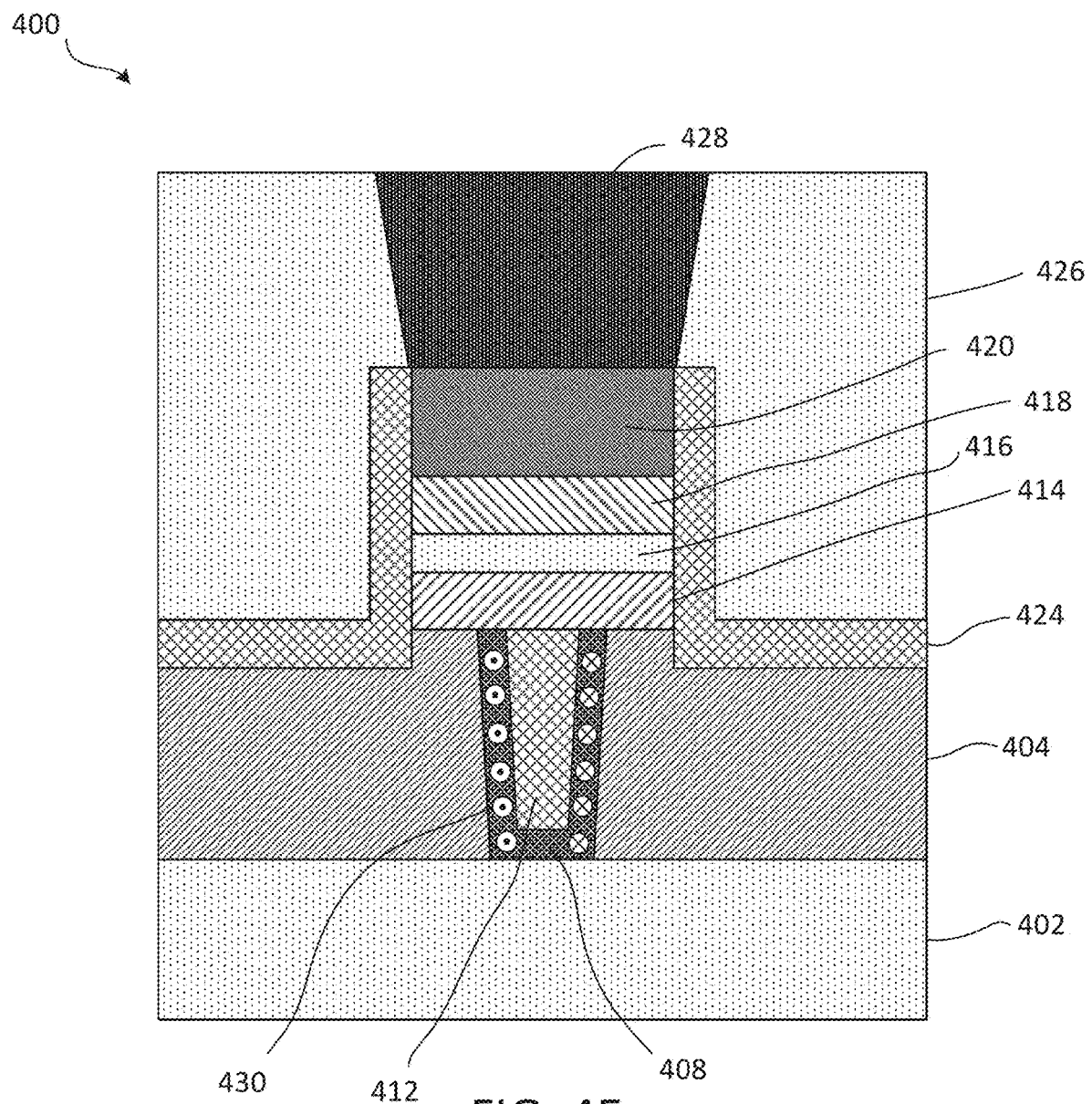
FIG. 4E is a cross-sectional view of the MRAM device of FIG. 4D after additional fabrication operations, according to embodiments.

Referring now to FIG. 4E, patterning is performed on the MRAM stack structure to form the MRAM device. In certain embodiments, a dielectric liner layer 424 is formed to encapsulate the MRAM device. The dielectric liner layer 424 may be comprised of SiN or any other suitable dielectric materials. As shown in FIG. 4E, the dielectric liner layer 424 covers the sidewall surfaces of the reference layer 414, the tunnel barrier layer 416, the magnetic free layer 418 and the top electrode 420. The dielectric liner layer 424 also covers top surfaces of the interlayer dielectric layer 404. Although not shown in FIG. 4E, the dielectric liner layer 424 may initially be formed to conformally cover the entire surface of the wafer, followed by formation of a portion of a second interlayer dielectric layer 426, followed by the removal of upper portions of the dielectric liner layer 424 and second interlayer dielectric layer 426 by a CMP process to expose the upper surface of the top electrode 420. Following the formation of the dielectric liner layer 424, additional material of the second interlayer dielectric layer 426 is added to increase the overall thickness of the second interlayer dielectric layer 426. Although not shown in FIG. 4E, portions of the second interlayer dielectric layer 426 are removed to create an interlayer dielectric layer via (not shown), and this interlayer dielectric layer via may accommodate subsequent formation of a top contact via 428.

In certain embodiments described herein, a more compact integration structure of the via interconnect structure 200 (bottom electrode of the MRAM device) may be achieved (see for example, FIGS. 2A-2D). This may enable a more compact cointegration with the logic region (MOL or BEOL layers). Also, the use of tungsten or TaN on the top part of the via interconnect structure 200 (i.e., the nonmagnetic metal layer 204) allows high quality planarization relative to the, for example, cobalt material of the magnetic metal layer 202. Moreover, the total volume of the low conductivity metal (e.g., W) of the nonmagnetic metal layer 204 may be reduced, which may reduce the overall contact resistance of the nonmagnetic metal layer 204 with the MRAM device stack structure. Furthermore, fringing magnetic field lines 430 may be confined in an in-plane direction within the low resistance magnetic metal (e.g., Co) of the magnetic metal layer 202, due to the dominant shape anisotropy of the magnetic metal layer 202. Thus, there will be no interaction, or little interaction with the MRAM magnetic structure. It should be appreciated that any suitable geometry of the magnetic metal layer 202 may be used, provided that the dominant shape anisotropy yields fringing magnetic field lines that are confined to be in-plane, or at least substantially in-plane.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A via interconnect structure for an MRAM device, the via interconnect structure comprising:
   an interlayer dielectric layer having a via formed therein;
   a magnetic metal layer formed in the via, the magnetic metal layer having a cavity formed therein; and
   a nonmagnetic metal layer formed in the cavity of the magnetic metal layer,
   wherein the magnetic metal layer is configured such that magnetization vectors of the magnetic metal layer are least substantially in-plane relative to an MRAM stack structure of the MRAM device.

2. The via interconnect structure of claim 1, wherein an upper surface of the nonmagnetic metal layer is above an upper surface of the magnetic metal layer.

3. The via interconnect structure of claim 2, wherein the upper surface of the nonmagnetic metal layer is at least substantially coplanar with the upper surface of the interlayer dielectric layer.

4. The via interconnect structure of claim 1, wherein an upper surface of the nonmagnetic metal layer is at least substantially coplanar with an upper surface of the magnetic metal layer.

5. The via interconnect structure of claim 1, wherein an upper surface of the nonmagnetic metal layer, an upper surface of the magnetic metal layer, and an upper surface of the interlayer dielectric layer are at least substantially coplanar.

6. The via interconnect structure of claim 1, wherein the nonmagnetic metal layer comprises at least one material selected from the group consisting of W and TaN.

7. The via interconnect structure of claim 1, wherein the magnetic metal layer comprises Co.

8. An MRAM device comprising:
   a via interconnect structure including
      an interlayer dielectric layer having a via formed therein,
      a magnetic metal layer formed in the via, the magnetic metal layer having a cavity formed therein, and
      a nonmagnetic metal layer formed in the cavity of the magnetic metal layer; and
   an MRAM stack structure formed on the via interconnect structure,
   wherein the magnetic metal layer is configured such that magnetization vectors of the magnetic metal layer are least substantially in-plane relative to the MRAM stack structure.

9. The MRAM device of claim 8, wherein an upper surface of the nonmagnetic metal layer is above an upper surface of the magnetic metal layer.

10. The MRAM device of claim 9, wherein the nonmagnetic metal layer directly contacts the MRAM stack structure.

11. The MRAM device of claim 9, wherein the upper surface of the nonmagnetic metal layer is at least substantially coplanar with an upper surface of the interlayer dielectric layer.

12. The MRAM device of claim 8, wherein an upper surface of the nonmagnetic metal layer is at least substantially coplanar with an upper surface of the magnetic metal layer.

13. The MRAM device of claim 12, wherein the nonmagnetic metal layer and the magnetic metal layer directly contact the MRAM stack structure.

* * * * *